(12) United States Patent
Noumi et al.

(10) Patent No.: US 7,142,068 B2
(45) Date of Patent: Nov. 28, 2006

(54) VOLTAGE CONTROLLED OSCILLATOR SMALL IN REDUCTION OF INDUCTANCE AND Q

(75) Inventors: Hiroki Noumi, Miyagi-ken (JP); Yasuhiro Ikarashi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 92 days.

(21) Appl. No.: 10/990,025

(22) Filed: Nov. 16, 2004

(65) Prior Publication Data

US 2005/0110585 A1    May 26, 2005

(30) Foreign Application Priority Data

Nov. 26, 2003   (JP)   ............... 2003-394878

(51) Int. Cl.
*H03B 5/12*   (2006.01)
(52) U.S. Cl. .................. 331/107 SL; 331/107 DP; 331/96; 331/108 C
(58) Field of Classification Search .......... 331/107 SL, 331/107 DP, 108 C, 96
See application file for complete search history.

(56) References Cited

U.S. PATENT DOCUMENTS 5,227,739 A    7/1993   Mandai et al.
6,388,535 B1   5/2002   Otsuki et al.

FOREIGN PATENT DOCUMENTS

| EP | 1 172 882 | 1/2002 |
|---|---|---|
| JP | 05-136612 | 6/1993 |
| JP | 05136612 | 9/1993 |
| JP | 2001-60827 | 3/2001 |
| JP | 2001136028 | 3/2001 |

OTHER PUBLICATIONS

Search Report dated Mar. 15, 2005 for European Patent Application No. EP 04 02 7441.

*Primary Examiner*—Arnold Kinkead
(74) *Attorney, Agent, or Firm*—Brinks Hofer Gilson & Lione (57) ABSTRACT

The voltage controlled oscillator contains a circuit board having a laminate of a plurality of insulating plates, a wiring pattern formed on a surface of the circuit board, an electronic part mounted on the surface of the circuit board, a resonance strip line provided on an inner layer of the circuit board, and a ground pattern formed on an inner layer of the circuit board which is disposed between the wiring pattern and the strip line. Further, a conductor-deleted portion of the ground pattern faces the vicinity including a portion having a high current density in the strip line. Thus, reductions of inductance and Q are small. In addition, a portion of the strip line is shielded by means of the ground pattern with respect to the wiring pattern.

8 Claims, 7 Drawing Sheets

VOLTAGE CONTROLLED OSCILLATOR SMALL IN REDUCTION OF INDUCTANCE AND Q

This application claims the benefit of priority to Japanese Patent Application No. 2003-394878 filed on Nov. 26, 2003, herein incorporated by reference.

BACKGROUND OF THE INVENTION

1. Field of the Invention

The present invention relates to a voltage controlled oscillator that is suitably used for a cellular phone or the like.

2. Description of the Related Art

Figure 13:
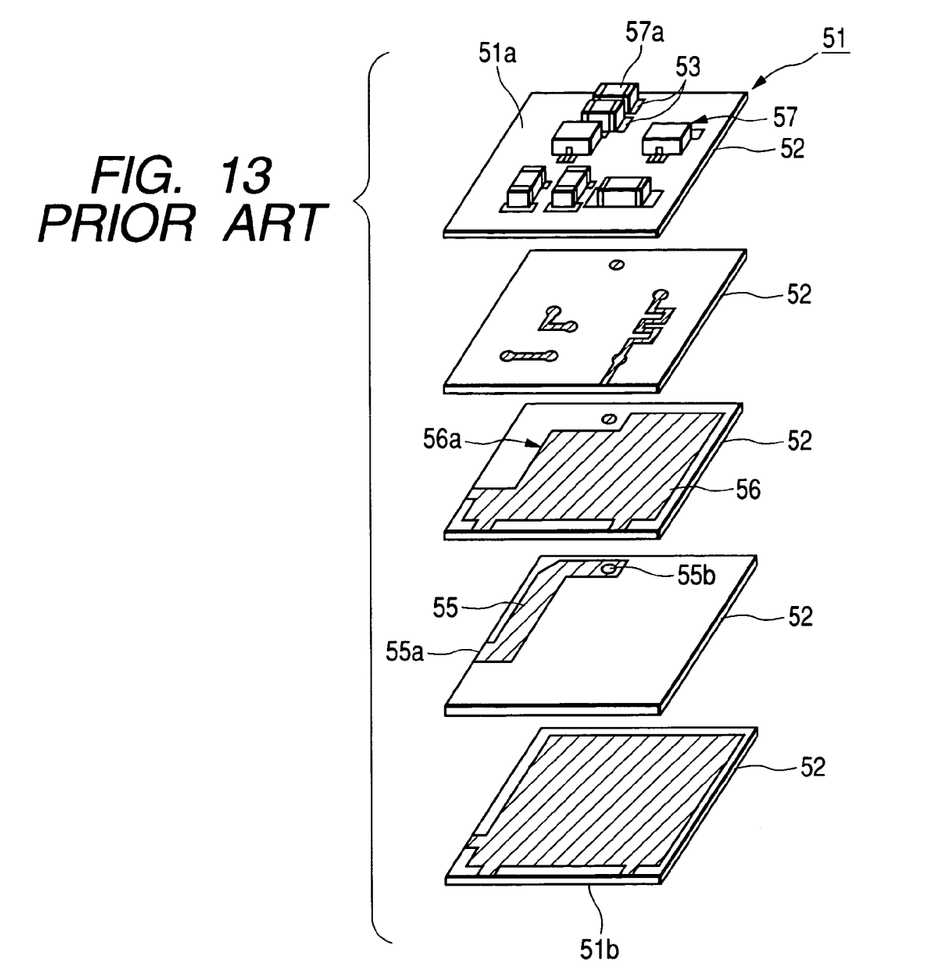
FIG. 13 is an exploded perspective view of a conventional voltage controlled oscillator.
Figure 14:
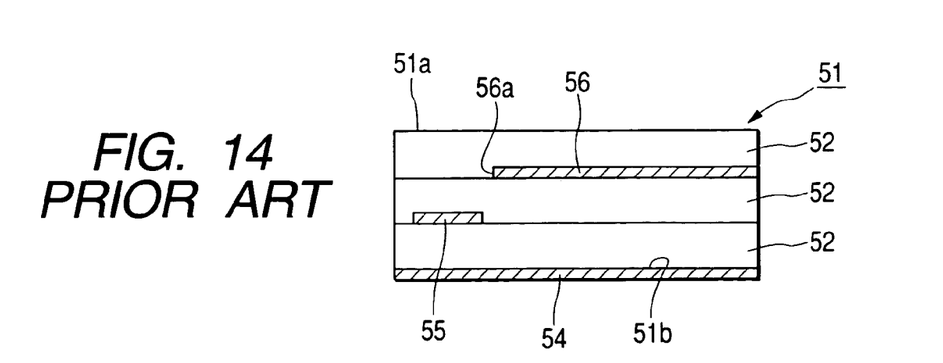
FIG. 14 is a cross-sectional view of essential parts of the conventional voltage controlled oscillator.

A conventional voltage controlled oscillator will be described with reference to the drawings. FIG. 13 is an exploded perspective view of the conventional voltage controlled oscillator, and FIG. 14 is a cross-sectional view of essential parts of the conventional voltage controlled oscillator.

Next, a configuration of the conventional voltage controlled oscillator will be described with reference to FIGS. 13 and 14. A circuit board 51 comprises a laminate of a plurality of thin insulating plates 52. On a surface 51a of the circuit board 51, a wiring pattern 53 made of a conductive pattern is provided. In addition, on an entire back surface 51b of the circuit board 51, a ground conductor 54 made of a conductive pattern is provided.

Further, on an inner layer of the circuit board 51, an L-shaped resonance strip line 55 made of a conductive pattern is provided. The resonance strip line 55 has connection portions 55a and 55b provided at both ends thereof.

thereof.

Furthermore, an entire back surface of the strip line 55 faces the ground conductor 54. In addition, the connection portion 55a of the strip line 55 is connected to the ground conductor 54 and the connection portion 55b thereof is connected to the wiring pattern 53.

Furthermore, on an inner layer of the circuit board 51 which is disposed between the wiring pattern 53 and the strip line 55, a ground pattern 56 made of a conductive pattern is provided. In addition, the ground pattern 56 has a conductor-deleted portion 56a which is provided at a position facing the surface of the strip line 55.

Further, the conductor-deleted portion 56a of the ground pattern 56 faces the entire surface of the strip line 55 and the ground pattern 56 is connected to the ground conductor 54 on the back surface of the circuit board 51.

Furthermore, on the surface 51a of the circuit board 51, various electronic parts 57 including a capacitor 57a and so on are mounted, such that a desired electrical circuit (oscillation circuit) is formed. When the electronic parts 57 are mounted on the circuit board 51, the capacitor 57a is connected to the connection portion 55b of the strip line 55 (for example, see Japanese Unexamined Patent Application Publication No. 5-136612).

Such a conventional voltage controlled oscillator has a configuration that the ground pattern 56 does not exist on the surface of the strip line 55 and the entire back surface of the strip line 55 faces the ground conductor 54, and thus reductions of inductance and Q are small. However, since the entire surface of the strip line 55 faces the surface 51a of the circuit board 51 through the conductor-deleted portion 56a, a shield characteristic between the strip line 55 and the wiring pattern 53 is deteriorated.

As described above, according to the conventional voltage controlled oscillator, since the entire surface of the strip line 55 faces the surface 51a of the circuit board 51 through the conductor-deleted portion 56a which is provided in the ground pattern 56, the shield characteristic between the strip line 55 and the wiring pattern 53 is deteriorated.

SUMMARY OF THE INVENTION

Accordingly, it is an object of the present invention to provide a voltage controlled oscillator having an excellent shield characteristic between a strip line and a wiring pattern and being small in reduction of inductance and Q.

In order to solve the above problems, according to a first aspect of the present invention, there is provided a voltage controlled oscillator comprising a circuit board having a laminate of a plurality of insulating plates, a wiring pattern formed on a surface of the circuit board, an electronic part mounted on the surface of the circuit board, a resonance strip line provided on an inner layer of the circuit board, and a ground pattern formed on an inner layer of the circuit board which is disposed between the wiring pattern and the strip line. Further, a conductor-deleted portion is provided in the ground pattern, and the ground pattern faces the strip line in a state in which the conductor-deleted portion faces the vicinity including a portion having a high current density in the strip line.

Further, according to a second aspect of the present invention, the strip line has a pair of conductors arranged to face each other and spaced at a predetermined gap from each other, connection portions respectively provided at one ends of the pair of conductors, and a connecting conductor for connecting the other ends of the pair of conductors to each other. Here, the strip line has a U shape.

Further, according to a third aspect of the present invention, a cut groove for frequency adjustment is provided in the portion having a high current density of the strip line.

Further, according to a fourth aspect of the present invention, the cut groove is formed in a range of the conductor-deleted portion.

Further, according to a fifth aspect of the present invention, a band-shaped protruding conductor which protrudes from a side of the connecting conductor opposite to the connection portions is provided in the connecting conductor of the strip line.

Furthermore, according to a sixth aspect of the present invention, by cutting a portion of the connecting conductor having a high current density in a widthwise direction of the connecting conductor, a cut groove for frequency adjustment is provided in the strip line to reach the connecting conductor.

Furthermore, according to a seventh aspect of the present invention, the cut groove is formed in a range of the conductor-deleted portion.

In addition, according to an eighth aspect of the present invention, the conductor-deleted portion faces the strip line in a range of from 50 percent to 80 percent of the surface area of the strip line.

In addition, according to a ninth aspect of the present invention, the wiring pattern which is arranged at a position facing the conductor-deleted portion is formed with a ground wiring pattern or/and a direct current (DC) wiring pattern.

DESCRIPTION OF THE PREFERRED EXAMPLES

Figure 1:
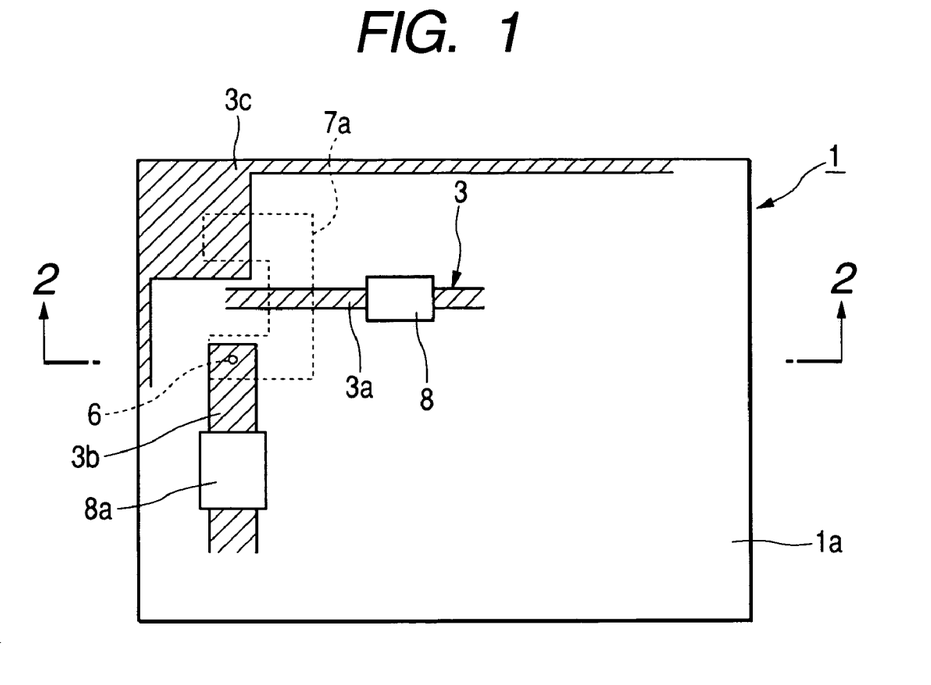
FIG. 1 is a plan view of a voltage controlled oscillator according to a first example of the present invention.
Figure 2:
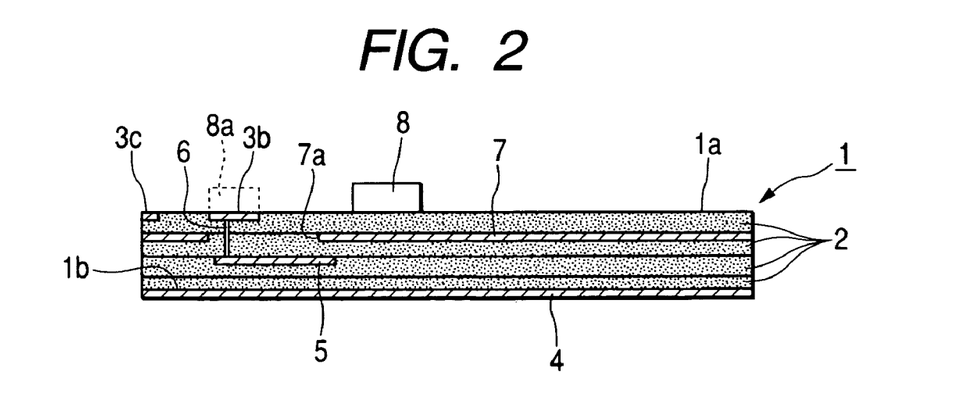
FIG. 2 is a cross-sectional view taken along the line 2—2 of FIG. 1.
Figure 3:
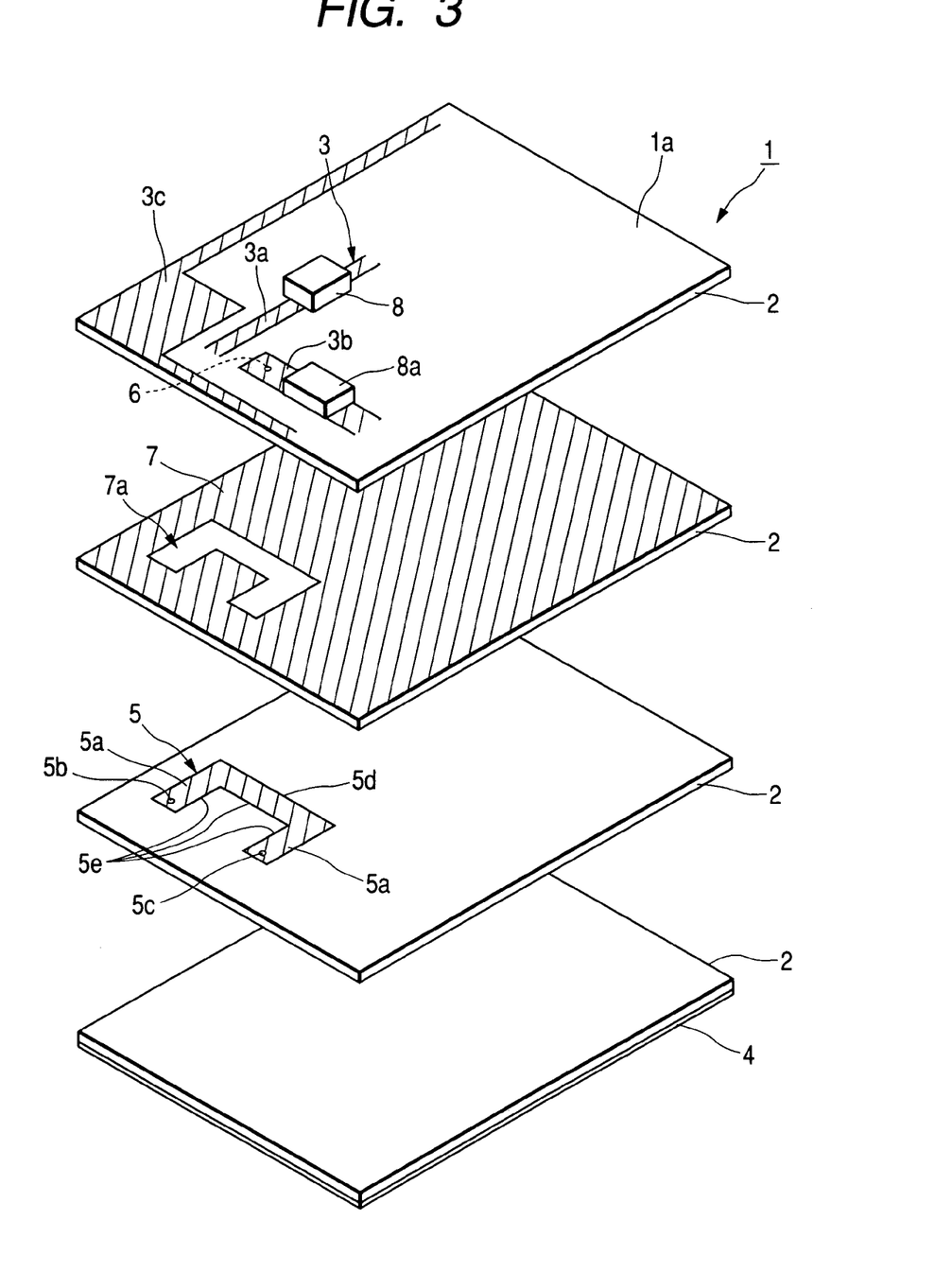
FIG. 3 is an exploded perspective view of the voltage controlled oscillator according to the first example of the present invention.
Figure 4:
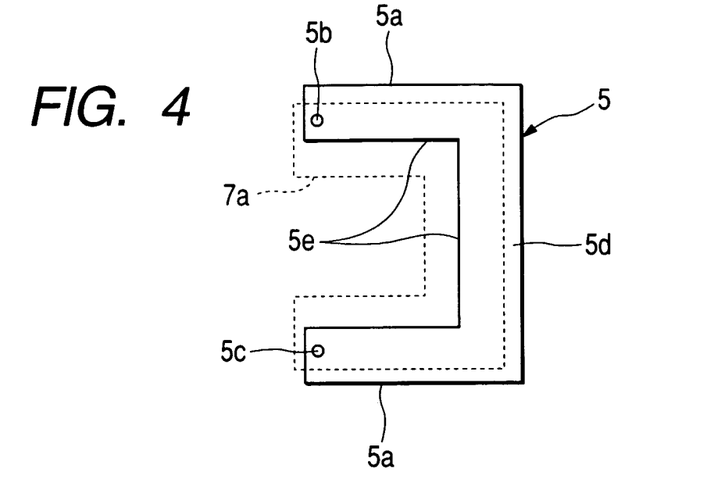
FIG. 4 is a diagram illustrating a relationship between a strip line and a conductor-deleted portion of a ground pattern in the voltage controlled oscillator according to the first example of the present invention.
Figure 5:
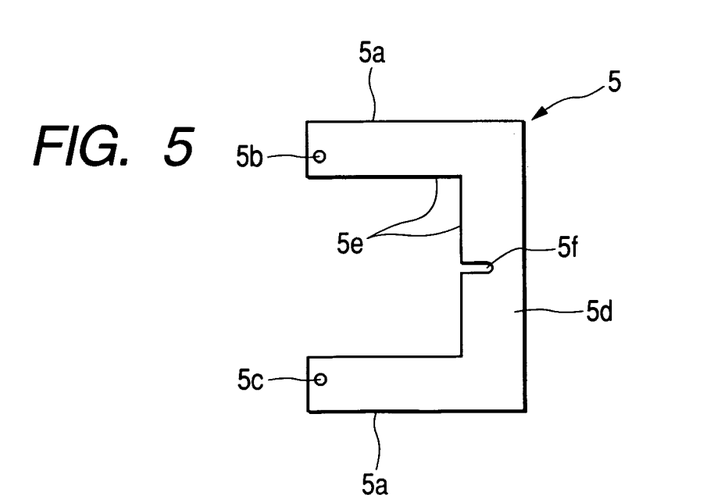
FIG. 5 is a plan view showing a cut groove for frequency adjustment in the voltage controlled oscillator according to the first example of the present invention.
Figure 6:
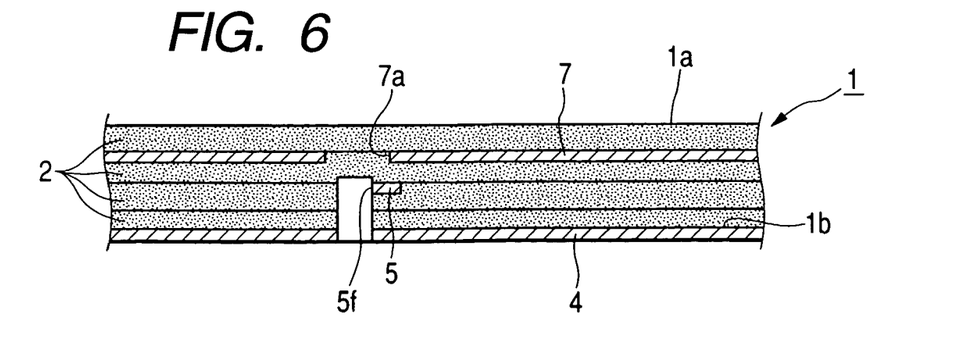
FIG. 6 is a schematic cross-sectional view of the cut groove for frequency adjustment in the voltage controlled oscillator according to the first example of the present invention.

A voltage controlled oscillator of the present invention will be described with reference to the drawings. FIG. 1 is a plan view of a voltage controlled oscillator according to a first example of the present invention, FIG. 2 is a cross-sectional view taken along the line 2—2 of FIG. 1, and FIG. 3 is an exploded perspective view of the voltage controlled oscillator according to the first example of the present invention. Further, FIG. 4 is a diagram illustrating a relationship between a strip line and a conductor-deleted portion of a ground pattern in the voltage controlled oscillator according to the first example of the present invention, FIG. 5 is a plan view showing a cut groove for frequency adjustment in the voltage controlled oscillator according to the first example of the present invention, and FIG. 6 is a schematic cross-sectional view of the cut groove for frequency adjustment in the voltage controlled oscillator according to the first example of the present invention.

Figure 7:
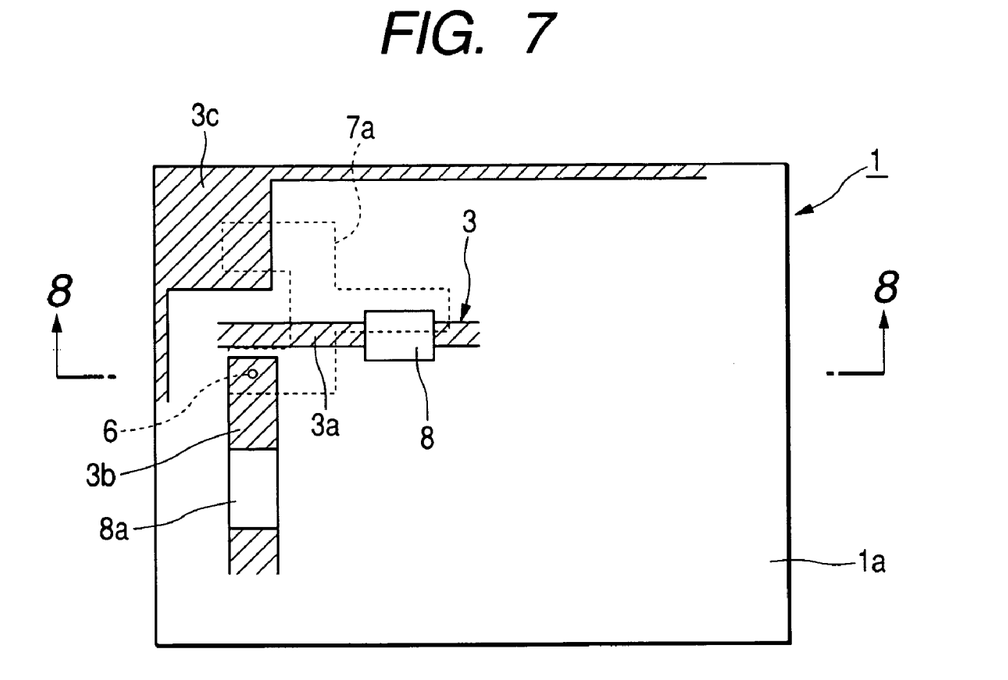
FIG. 7 is a plan view of a voltage controlled oscillator according to a second example of the present invention.
Figure 8:
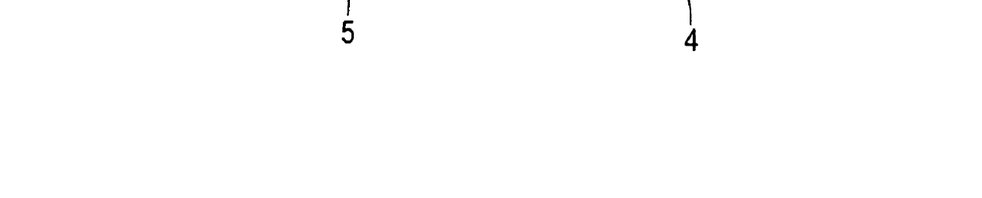
FIG. 8 is a cross-sectional view taken along the line 8—8 of FIG. 7.
Figure 9:
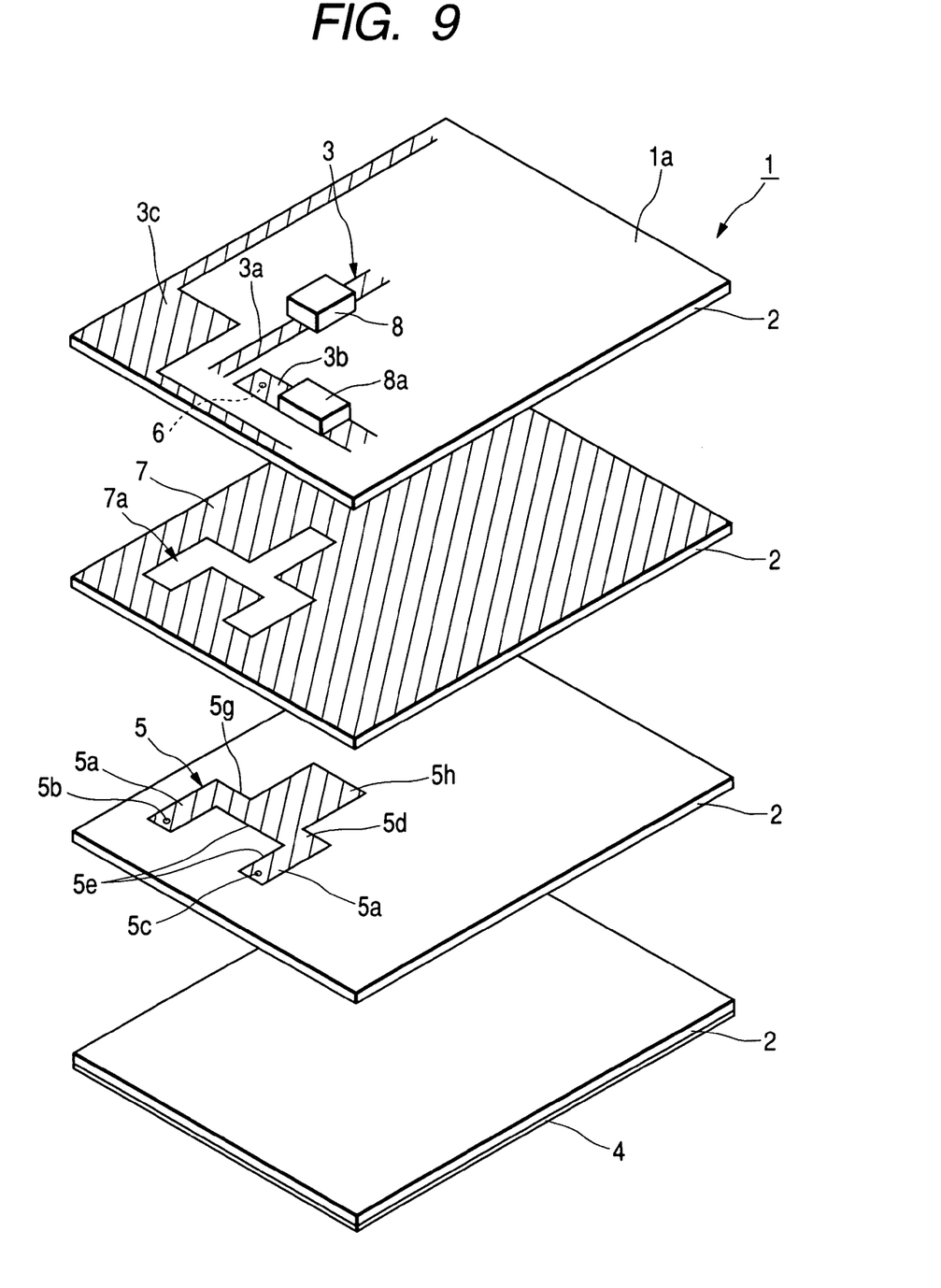
FIG. 9 is an exploded perspective view of the voltage controlled oscillator according to the second example of the present invention.
Figure 10:
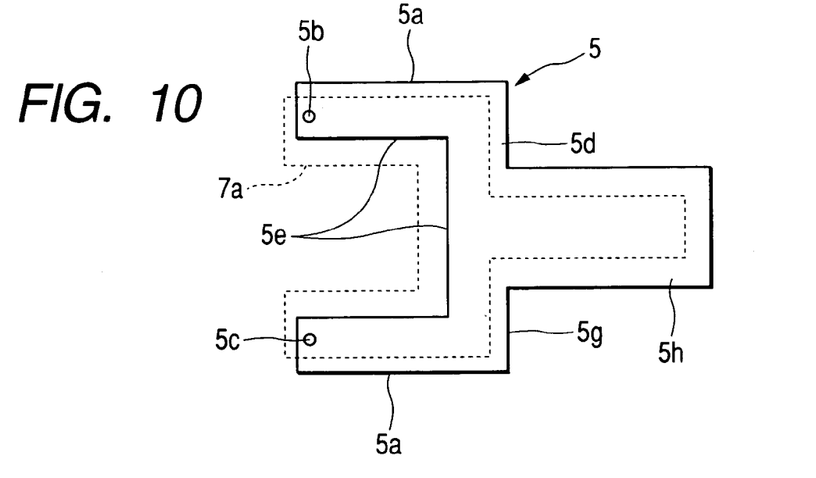
FIG. 10 is a diagram illustrating a relationship between a strip line and a conductor-deleted portion of a ground pattern in the voltage controlled oscillator according to the second example of the present invention.
Figure 11:
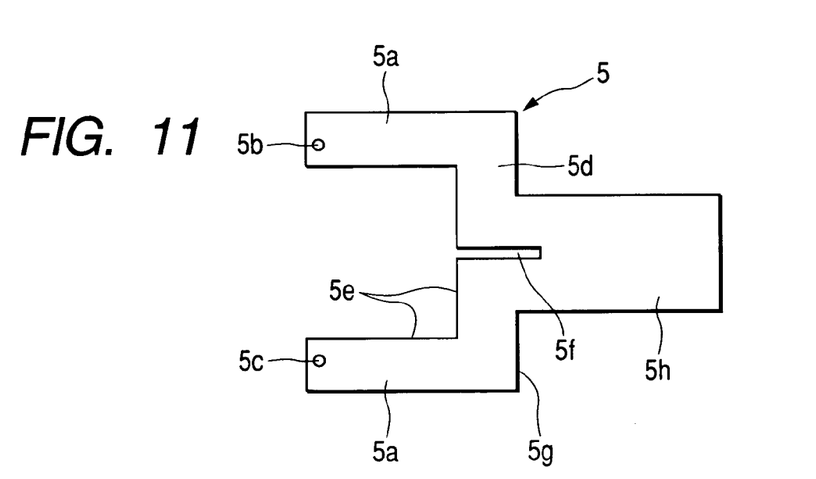
FIG. 11 is a plan view showing a cut groove for frequency adjustment in the voltage controlled oscillator according to the second example of the present invention.
Figure 12:
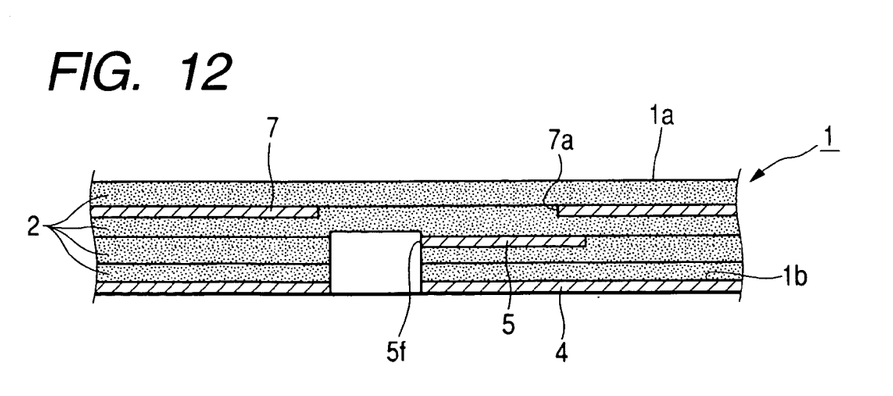
FIG. 12 is a schematic cross-sectional view of the cut groove for frequency adjustment in the voltage controlled oscillator according to the second example of the present invention.

Further, FIG. 7 is a plan view of a voltage controlled oscillator according to a second example of the present invention, FIG. 8 is a cross-sectional view taken along the line 8—8 of FIG. 7, and FIG. 9 is an exploded perspective view of the voltage controlled oscillator according to the second example of the present invention. In addition, FIG. 10 is a diagram illustrating a relationship between a strip line and a conductor-deleted portion of a ground pattern in the voltage controlled oscillator according to the second example of the present invention, FIG. 11 is a plan view showing a cut groove for frequency adjustment in the voltage controlled oscillator according to the second example of the present invention, and FIG. 12 is a schematic cross-sectional view of the cut groove for frequency adjustment in the voltage controlled oscillator according to the second example of the present invention.

Next, a configuration of a voltage controlled oscillator according to a first example of the present invention will be described with reference to FIGS. 1 to 6. A circuit board 1 has a laminate of a plurality of thin insulating plates 2 such as resin and ceramic.

A wiring pattern 3 made of a conductive pattern which is provided on a surface 1a of the circuit board 1 has a direct current (DC) wiring pattern 3a, a signal wiring pattern 3b, and a ground wiring pattern 3c which is disposed in an outer circumference of the circuit board 1. On an entire back surface 1b of the circuit board 1, a ground conductor 4 made of a conductive pattern is provided.

Further, a U-shaped resonance strip line 5 which is made of a conductive pattern and which is provided on an inner layer of the circuit board 1 has a pair of conductors 5a arranged to face each other and spaced at a predetermined gap from each other, connection portions 5b and 5c respectively provided at one ends of the pair of conductors 5a, and a connecting conductor 5d for connecting the other ends of the pair of conductors 5a to each other.

And then, the connection portion 5b of the strip line 5 is connected to a ground conductor 4 via a connection conductor (through hole), which is not shown. At the same time, as shown in FIG. 2, the connection portion 5c is connected to the signal wiring pattern 3b via a connection conductor (through hole) 6.

In the strip line 5 having the above-mentioned structure, an entire back surface of the strip line 5 faces the ground conductor 4 and inner sides 5e disposed at an inside of the strip line in an U shape have a high current density.

In addition, on an inner layer of the circuit board 1 located between the wiring pattern 3 and the strip line 5, a ground pattern 7 made of a conductive pattern is provided. In the ground pattern 7, a U-shaped conductor-deleted portion 7a is provided at a position facing a portion of a surface of the strip line 5.

As shown in FIG. 4, the ground pattern 7 is arranged to face the strip line 5 in a state in which the conductor-deleted portion 7a faces the vicinity including the portion having a high current density in the strip line 5.

Specifically, the conductor-deleted portion 7a faces the vicinity including the portion having a high current density in the strip line 5. Further, a portion of the ground pattern 7 faces the portion having a low current density in the strip line 5 and the conductor-deleted portion 7a faces the strip line 5 in a range of from 50 percent to 80 percent of the surface area of the strip line 5.

In addition, a relationship between the conductor-deleted portion 7a of the ground pattern 7 and the strip line 5 is the same as described above. However, as shown in FIG. 1, a relationship between the conductor-deleted portion 7a of the ground pattern 7 and the wiring pattern 3 is such that the direct current (DC) wiring pattern 3a and the ground wiring pattern 3c face the conductor-deleted portion 7a.

In the present example, the direct current (DC) wiring pattern 3a and the ground wiring pattern 3c face the conductor-deleted portion 7a. Alternatively, however, any one of the direct current wiring pattern 3a and the ground wiring pattern 3c may face the conductor-deleted portion 7a.

Furthermore, on the surface 1a of the circuit board 1, various electronic parts 8 including a capacitor 8a is mounted, such that a desired electrical circuit (oscillation circuit) is formed. When the electronic parts 8 are mounted on the circuit board 1, the capacitor 8a is connected to the connection portion 5c of the strip line 5 via the signal wiring pattern 3b and the connection conductor 6.

In such a manner, the voltage controlled oscillator of the present invention is formed. Next, a method for adjusting a frequency will be described with reference to FIGS. 5 and 6. First, a portion of the ground conductor 4, the insulating plate 2, and the strip line 5 are deleted using a cutting method (not shown) such as a laser from the back surface 1b of the circuit board 1. And then, as shown in FIG. 5, a cut groove 5f is provided in the strip line 5. By means of such a configuration, a frequency adjustment is performed.

In addition, the cut groove 5f is formed by deleting the portion of the inner sides 5e having high current densities, which are disposed at the inside of the U-shaped strip line 5, within a range of the conductor-deleted portion 7a of the ground pattern 7.

In addition, in the above-mentioned example, the strip line 5 having the U shape is described, but the strip line 5 may be formed in a linear shape or a zigzag shape.

Further, FIGS. 7 to 12 show a voltage controlled oscillator according to a second example of the present invention. According to the second example, a strip line 5 has a pair of conductors 5a arranged to face each other and spaced at a predetermined gap from each other, connection portions 5b and 5c provided at one ends of the pair of conductors 5a, and a connecting conductor 5d for connecting the other ends of the pair of conductors 5a to each other. Further, in the connecting conductor 5d, a band-shaped protruding conductor 5h which protrudes from an outer side 5g of the connecting conductor 5d opposite to the connection portions 5b and 5c. As a result, the strip line 5 has a substantially Y shape.

In addition, a conductor-deleted portion 7a of a ground pattern 7 has a U-shaped portion facing the vicinity including a portion having a high current density in the strip line 5 and a band-shaped portion facing a central portion of the protruding conductor 5h. As a result, the conductor-deleted portion 7a has a substantially Y shape. A cut groove 5f is provided by cutting a portion of the connecting conductor 5d having a high current density in a widthwise direction of the connecting conductor, to thereby reach the protruding conductor 5h.

Since other elements of the second example are the same as those of the first example, the same elements are represented by the same reference numerals, and then the description of the same elements will be omitted.

In the second example, the conductor-deleted portion 7a also faces the strip line 5 in a range of from 50 percent to 80 percent of the surface area of the strip line 5.

According to the present invention, a voltage controlled oscillator comprises a circuit board having a laminate of a plurality of insulating plates, a wiring pattern formed on a surface of the circuit board, an electronic part mounted on the surface of the circuit board, a resonance strip line provided on an inner layer of the circuit board, and a ground pattern formed on an inner layer of the circuit board which is disposed between the wiring pattern and the strip line.

Further, a conductor-deleted portion is provided in the ground pattern, and the ground pattern faces the strip line in a state in which the conductor-deleted portion faces the vicinity including a portion having a high current density in the strip line.

In such a manner, since the conductor-deleted portion of the ground pattern faces the vicinity including a portion having a high current density in the strip line, reductions of inductance and Q are small. In addition, a portion of the strip line which does not face the conductor-deleted portion faces the ground pattern, and thus a portion of the strip line is shielded by the ground pattern with respect to the wiring pattern. As a result, it is possible to obtain an excellent shield characteristic.

In addition, the strip line has a pair of conductors arranged to face each other and spaced at a predetermined gap from each other, connection portions respectively provided at one ends of the pair of conductors, and a connecting conductor for connecting the other ends of the pair of conductors to each other. Further, the strip line has a U shape. Thus, the strip line can be miniaturized and the portion having a high current density can be concentrated at inner sides having a U shape. Therefore, the portion having a high current density in the strip line can be integrated small and also the conductor-deleted portion can be small. As a result, it is possible to realize a favorable shield characteristic.

In addition, a cut groove for frequency adjustment is formed in a portion having a high current density in the strip line. Thus, a range of a frequency adjustment-increases. As a result, it is possible to realize a favorable a frequency adjustment.

In addition, since the cut groove is formed in a range of the conductor-deleted portion, the cut groove having a high current density is opened through the conductor-deleted portion. Therefore, the reductions of inductance and Q can be small.

In addition, a band-shaped protruding conductor which protrudes from a side of the connecting conductor opposite to the connection portions is provided in the connecting conductor of the strip line. Thus, the cut groove for frequency adjustment can extend to the protruding conductor. Therefore, it is possible to increase a range of the frequency adjustment.

In addition, by cutting a portion of the connecting conductor having a high current density in the strip line in a widthwise direction of the connecting conductor, a cut groove for frequency adjustment is provided to reach the protruding conductor. Therefore, it is possible to increase a range of frequency adjustment.

In addition, since the cut groove is formed in a range of the conductor-deleted portion, the cut groove having a high current density is opened through the conductor-deleted portion. Therefore, the reductions of inductance and Q can be small.

In addition, the conductor-deleted portion faces the strip line in a range of from 50 percent to 80 percent of the surface area of the strip line. Thus, the reductions of inductance and Q can be small by means of the conductor-deleted portion having a large area. In addition, the portion of the strip line having a relatively small area is shield by means of the ground pattern which is disposed between the wiring line and the strip line. Therefore, it is possible to realize a favorable shield characteristic.

In addition, the wiring pattern which is arranged at a position facing the conductor-deleted portion is formed with a ground wiring pattern or/and a direct current (DC) wiring pattern. Thus, there is no need for connecting the strip line to other signal lines. Therefore, it is possible to realize a favorable electrical performance.

What is claimed is:

1. A voltage controlled oscillator comprising:
a circuit board having a laminate of a plurality of insulating plates;
a wiring pattern formed on a surface of the circuit board;
an electronic part mounted on a surface of the circuit board;
a resonance strip line provided on an inner layer of the circuit board; and
a ground pattern formed on an inner layer of the circuit board which is disposed between the wiring pattern and the strip line,
wherein a conductor-deleted portion is provided in the ground pattern, and
the ground pattern faces the strip line in a state in which the conductor-deleted portion faces the vicinity including a portion having a high current density in the strip line, and
wherein the conductor-deleted portion faces the strip line in a range of 50 percent to 80 percent of a surface area of the strip line.

2. The voltage controlled oscillator according to claim 1, wherein the strip line includes a pair of conductors arranged to face each other and spaced at a predetermined gap from each other, connection portions respectively provided at first ends of the pair of conductors, and a connecting conductor for connecting second ends of the pair of conductors to each other, and the strip line has a U shape.

3. The voltage controlled oscillator according to claim 1, wherein a cut groove for frequency adjustment is formed in the portion having the high current density in the strip line.

4. The voltage controlled oscillator according to claim 3, wherein the cut groove is formed in a range of the conductor-deleted portion.

5. The voltage controlled oscillator according to claim 2, wherein a band-shaped protruding conductor which protrudes from a side of the connecting conductor opposite to the connection portions is provided in the connecting conductor of the strip line.

6. The voltage controlled oscillator according to claim 5, wherein by cutting a portion of the connecting conductor having a high current density in the strip line in a widthwise direction of the connecting conductor, a cut groove for frequency adjustment is provided to reach a protruding conductor.

7. The voltage controlled oscillator according to claim 6, wherein the cut groove is formed in a range of the conductor-deleted portion.

8. The voltage controlled oscillator according to claim 1, wherein the wiring pattern which is arranged at a position facing the conductor-deleted portion is formed with at least one of a ground wiring pattern and a direct current (DC) wiring pattern.

* * * * *